United States Patent
Tosaka

(10) Patent No.: US 8,394,686 B2
(45) Date of Patent: Mar. 12, 2013

(54) DRY ETCHING METHOD OF SILICON COMPOUND FILM

(75) Inventor: Hisao Tosaka, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 28 days.

(21) Appl. No.: 12/555,182

(22) Filed: Sep. 8, 2009

(65) Prior Publication Data
US 2010/0075491 A1  Mar. 25, 2010

(30) Foreign Application Priority Data

Sep. 19, 2008  (JP) .................................. 2008-240537

(51) Int. Cl.
*H01L 21/00*  (2006.01)
(52) U.S. Cl. ................. 438/159; 438/158; 257/E21.219
(58) Field of Classification Search .................. 438/158, 438/159, 164
See application file for complete search history.

(56) References Cited

U.S. PATENT DOCUMENTS

| | | | | |
|---|---|---|---|---|
| 4,310,380 | A | * | 1/1982 | Flamm et al. .................. 438/719 |
| 6,258,723 | B1 | * | 7/2001 | Takeichi et al. ............... 438/706 |
| 2002/0014470 | A1 | * | 2/2002 | Okada et al. .................... 216/24 |

FOREIGN PATENT DOCUMENTS

| | | | |
|---|---|---|---|
| JP | 05-226654 | A | 9/1993 |
| JP | 10-223614 | * | 8/1998 |
| JP | 10-223614 | A | 8/1998 |
| JP | 11-274143 | A | 10/1999 |
| JP | 2000-195848 | A | 7/2000 |
| JP | 2003-045891 | * | 2/2003 |
| JP | 2003-045891 | A | 2/2003 |
| JP | 2003-101029 | A | 4/2003 |
| JP | 2006-024823 | A | 1/2006 |
| JP | 2007-079342 | A | 3/2007 |
| JP | 2007-294642 | A | 11/2007 |

OTHER PUBLICATIONS

Japanese Office Action dated Jun. 9, 2010 and English translation thereof, issued in counterpart Japanese Application No. 2008-240537.

Chinese Office Action dated Aug. 19, 2010 (and English translation thereof) in counterpart Chinese Application No. 200910175508.4.

* cited by examiner

*Primary Examiner* — Charles Garber
*Assistant Examiner* — Reema Patel
(74) *Attorney, Agent, or Firm* — Holtz, Holtz, Goodman & Chick, PC

(57) ABSTRACT

A silicon compound film is dry etched by parallel-plate type dry etching using an etching gas including at least $COF_2$.

17 Claims, 22 Drawing Sheets

DRY ETCHING METHOD OF SILICON COMPOUND FILM

CROSS-REFERENCE TO RELATED APPLICATION

This application is based upon and claims the benefit of priority from the prior Japanese Patent Application No. 2008-240537, filed Sep. 19, 2008, the entire contents of which is incorporated herein by reference.

BACKGROUND OF THE INVENTION

1. Field of the Invention

The present invention relates to a dry etching method of a silicon compound film.

2. Description of the Related Art

As a conventional thin film transistor, there is, for example, a reverse-staggered type thin film transistor. In this reverse-staggered type thin film transistor, a gate electrode is provided on the upper surface of a substrate, and a gate insulating film is provided on the upper surface of the substrate including the gate electrode. In addition, a semiconductor thin film made of intrinsic amorphous silicon is provided on the upper surface of the gate insulating film, above the gate electrode. Moreover, ohmic contact layers made of n-type amorphous silicon are provided on both sides of the upper surface of the semiconductor thin film, and a source electrode and a drain electrode are provided on the upper surface of each ohmic contact layer.

In the method of forming the ohmic contact layer and the semiconductor thin film in the conventional thin film transistor described above, the intrinsic amorphous silicon film (semiconductor thin film formation film) and the n-type amorphous silicon film (ohmic contact layer formation film) formed on the upper surface of the gate insulating film are sequentially dry etched. In this case, sulfur hexafluoride (SF6) gas is used as an etching gas.

However, SF6 as the etching gas used in a conventional dry etching method such as described above has an extremely high warming potential of several thousand to several tens of thousands. Therefore, in recent years, SF6 has been regarded as a problem that contributes to global warming. Accordingly, the selection of an alternative gas replacing SF6 is an important issue.

SUMMARY OF THE INVENTION

The present invention has been conceived to solve the above-described issues. An object of the present invention is to provide a dry etching method of a silicon compound film in which materials constituting a thin film transistor, such as an amorphous silicon film and a silicon nitride film, are successfully dry etched without use of a gas such as SF6 which contributes to global warming.

In order to achieve the above-described object, in accordance with one aspect of the present invention, there is provided a dry etching method of a silicon compound film, wherein a silicon compound film is dry etched by parallel-plate type dry etching using an etching gas including at least $COF_2$.

In the dry etching method of a silicon compound film according to the present invention, a silicon compound film is dry etched by parallel plate type dry etching using an etching gas containing at least $COF_2$.

According to the present invention, since silicon compound film such as an amorphous silicon film is dry etched by parallel plate type dry etching using an etching gas containing at least $COF_2$, a silicon compound film such as an amorphous silicon film is successfully dry etched without use of a gas such as SF6 which contributes to global warming.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE PREFERRED EMBODIMENTS

The present invention will hereinafter be described in detail with reference to the preferred embodiments shown in the accompanying drawings.

Figure 1:
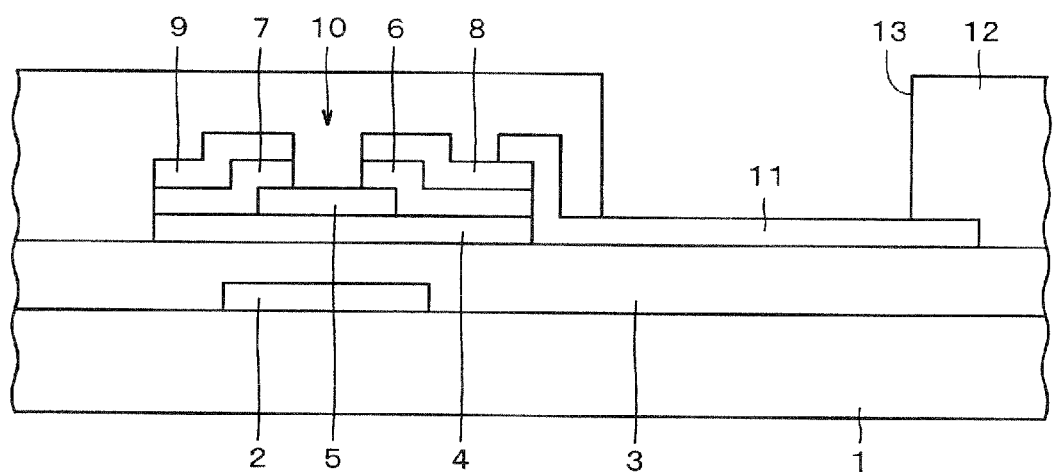
FIG. 1 is a cross-sectional view of an example of a thin film transistor panel manufactured by a manufacturing method including a dry etching method according to the present invention.

FIG. 1 is a cross-sectional view of an example of a thin film transistor panel manufactured by a manufacturing method including a dry etching method according to the present invention.

This thin film transistor panel includes a glass substrate 1. A gate electrode 2 made of metal such as chrome is provided in a predetermined area on the upper surface of the gas substrate 1. A gate insulating film 3 made of silicon nitride is provided on the upper surface of the gas substrate 1 including the gate electrode 2.

A semiconductor thin film 4 made of intrinsic amorphous silicon is provided in a predetermined portion on the upper surface of the gate insulating film 3, above the gate electrode 2. A channel protective film 5 made of silicon nitride is provided in a predetermined portion on the upper surface of the semiconductor thin film 4. Ohmic contact layers 6 and 7 made of n-type amorphous silicon are provided on the upper surface of the semiconductor thin film 4 on both sides of the upper surface of the channel protection film 5 and both sides of the channel protection film 5. A source electrode 8 and a drain electrode 9 made of metal such as chrome are respectively provided on the upper surfaces of the ohmic contact layers 6 and 7.

Here, the gate electrode 2, the gate insulating film 3, the semiconductor thin film 4, the channel protection film 5, the ohmic contact layers 6 and 7, the source electrode 8, and the drain electrode 9 constitute a channel-protection-film type thin film transistor 10 of a reverse-staggered type.

A pixel electrode 11 made of indium-tin-oxide (ITO) is provided on a predetermined portion of the upper surface of the gate insulating film 3 and a portion of the upper surface of the source electrode 8. An overcoat film 12 made of silicon nitride is provided on the upper surfaces of the gate insulating film 3 including the thin film transistor 10 and the pixel electrode 11. In this embodiment, an opening 13 is provided in a portion of the overcoat film 12 corresponding to areas other than the periphery of the pixel electrode 11.

Next, an example of a manufacturing method of this thin film transistor panel will be described.

Figure 2:
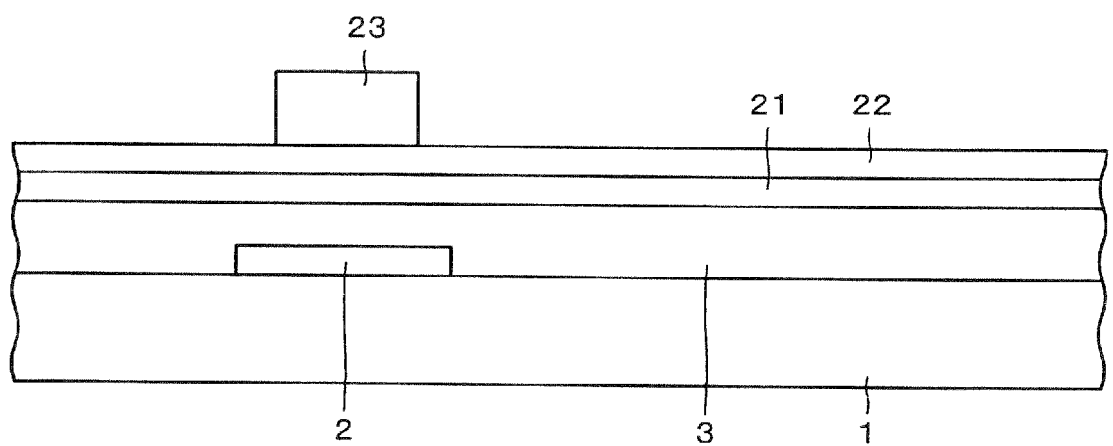
FIG. 2 is a cross-sectional view of an initial procedure in an example of the manufacturing method of the thin film transistor panel shown in FIG. 1.

First, as shown in FIG. 2, the gate electrode 2 is formed on a predetermined portion of the upper surface of the glass substrate 1 by a metal film made of chrome and the like formed by sputtering being patterned by photolithographic method.

Then, a silicon nitride film (gate insulating film 3) 3, an intrinsic amorphous silicon film (semiconductor thin film 4 formation film) 21, and a silicon nitride film (channel protection film 5 formation film) 22 are sequentially formed by plasma chemical vapor deposition (CVD) on the upper surface of the glass substrate 1 including the gate electrode 2. Next, a resist film is applied by screen-printing, spin-coating, and the like to a channel protection film 5 formation area of the upper surface of the silicon nitride film 22, and then patterned by photolithography to form a resist film 23.

Figure 3:
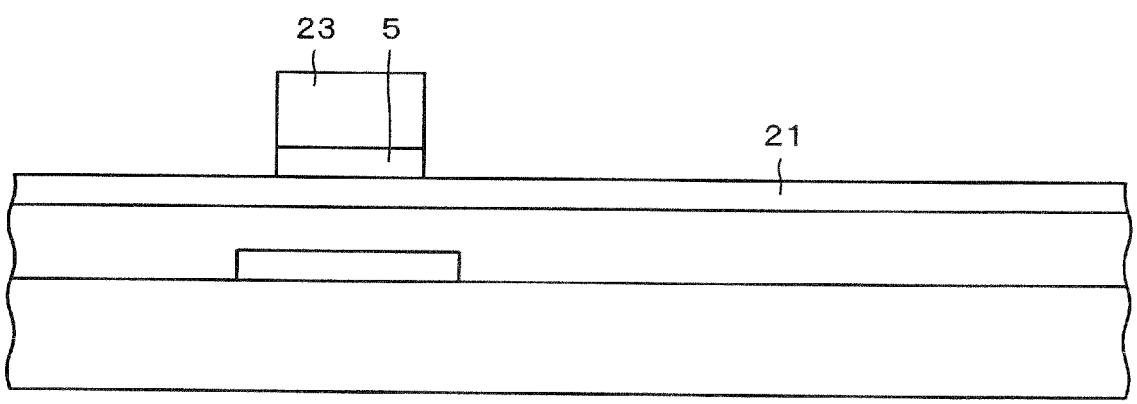
FIG. 3 is a cross-sectional view of a procedure subsequent to that in FIG. 2.

Next, the silicon nitride film 22 is dry etched using the resist film 23 as a mask, and as a result the silicon nitride film 22 is removed from areas other than the area under the resist film 23, thereby forming the channel protection film 5 under the resist film 23 as shown in FIG. 3. The resist film 23 is then peeled off.

Figure 4:
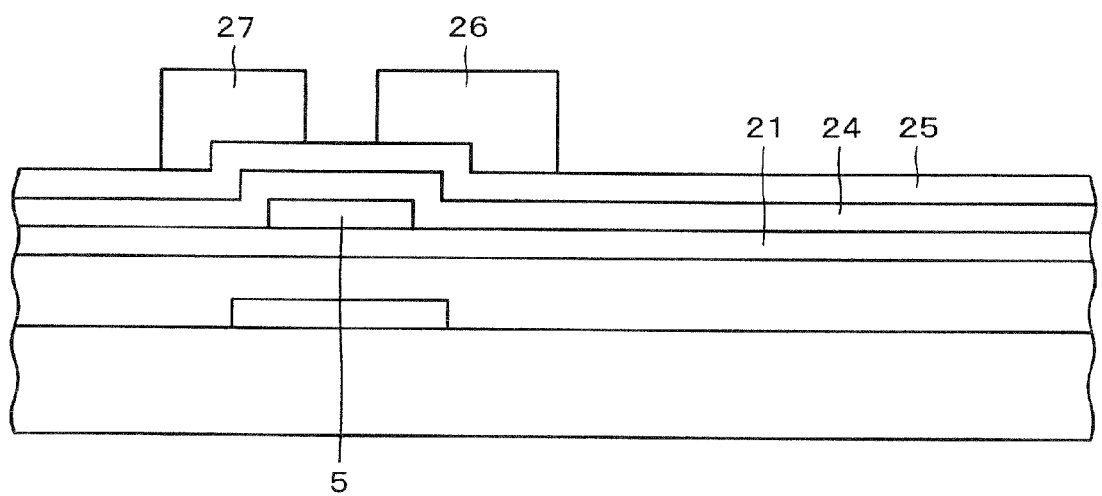
FIG. 4 is a cross-sectional view of a procedure subsequent to that in FIG. 3.

Next, as shown in FIG. 4, an n-type amorphous silicon film (ohmic contact layers 6 and 7 formation film) 24 is formed by plasma CVD on the upper surface of the intrinsic amorphous silicon film 21 including the channel protection film 5. Then, a source/drain electrode formation film 25 made of metal such as chrome is formed by sputtering on the upper surface of the n-type amorphous silicon film 24.

Next, resist films 26 and 27 are formed on a source electrode 8 formation area and a drain electrode 9 formation area of the upper surface of the source/drain electrode formation film 25 by a resist film applied by screen-printing, spin-coating, and the like being patterned by photolithographic method.

Figure 5:
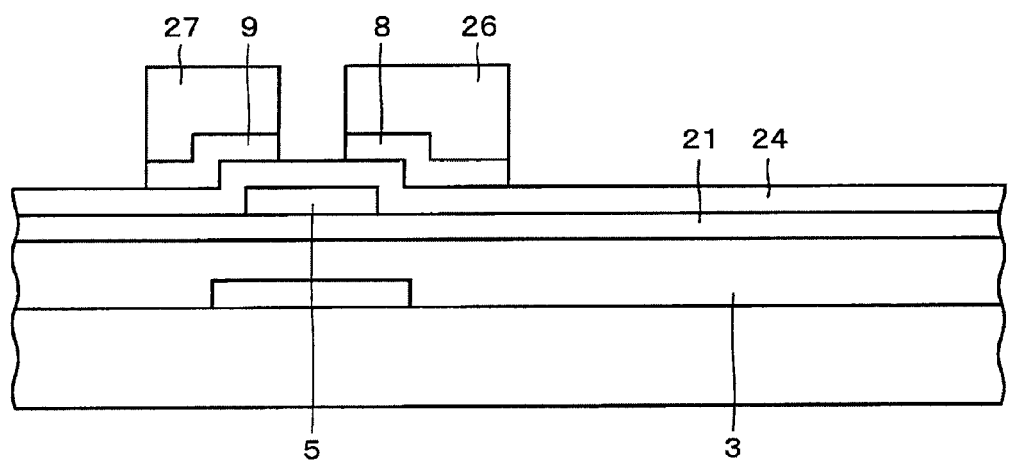
FIG. 5 is a cross-sectional view of a procedure subsequent to that in FIG. 4.

Next, the source/drain electrode formation film 25 is wet-etched using the resist films 26 and 27 as masks, and as a result the source/drain electrode formation film 25 is removed from areas other than the areas under the resist films 26 and 27, thereby forming the source electrode 8 and the drain electrode 9 under the resist films 26 and 27 as shown in FIG. 5.

Next, the source/drain electrode formation film 25 is wet-etched using the resist films 26 and 27 as masks, and as a result the source/drain electrode formation film 25 is removed from areas other than the areas under the resist films 26 and 27, thereby forming the source electrode 8 and the drain electrode 9 under the resist films 26 and 27 as shown in FIG. 5.

In this state, the channel-protection-film type thin film transistor 10 of a reverse-staggered type has been formed by the gate electrode 2, the gate insulating film 3, the semiconductor thin film 4, the channel protection film 5, the ohmic contact layers 6 and 7, the source electrode 8, and the drain electrode 9. Then, the resist films 26 and 27 are peeled off.

Figure 7:
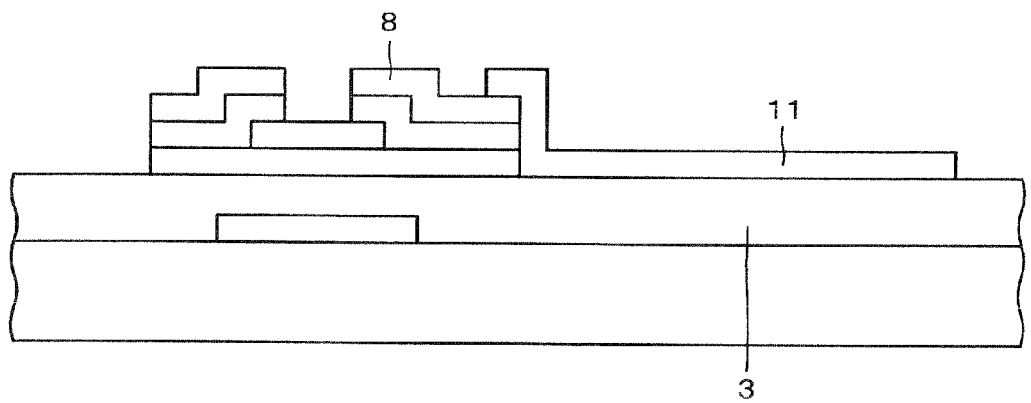
FIG. 7 is a cross-sectional view of a procedure subsequent to that in FIG. 6.

Next, as shown in FIG. 7, the pixel electrode 11 is formed on a predetermined portion of the upper surface of the gate insulating film 3 and a portion of the upper surface of the source electrode 8 by an ITO film formed by sputtering being patterned by photolithography.

Figure 8:
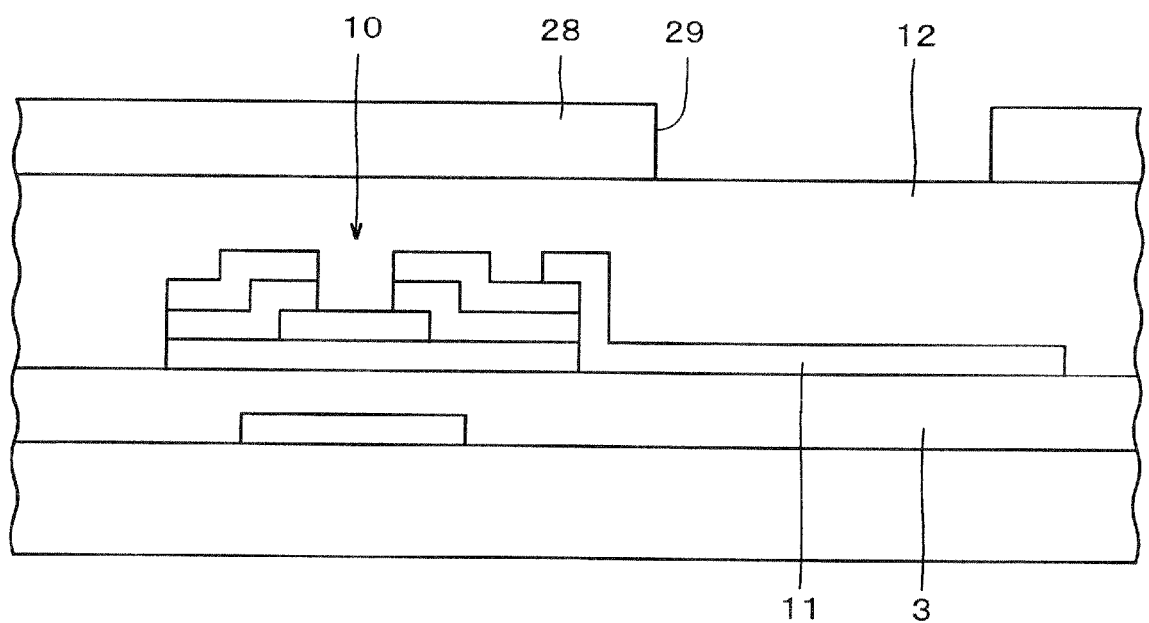
FIG. 8 is a cross-sectional view of a procedure subsequent to that in FIG. 7.

Next, as shown in FIG. 8, the overcoat film 12 made of silicon nitride is formed by plasma CVD on the upper surface of the gate insulating film 3 including the thin film transistor 10 and the pixel electrode 11. Then, a resist film 28 is formed on the upper surface of the overcoat film 12 by a resist film applied by screen-printing, spin-coating, and the like being patterned by photolithography. In this embodiment, an opening 29 is formed in a portion of the resist film 28 corresponding to areas other than the periphery of the pixel electrode 11.

Figure 9:
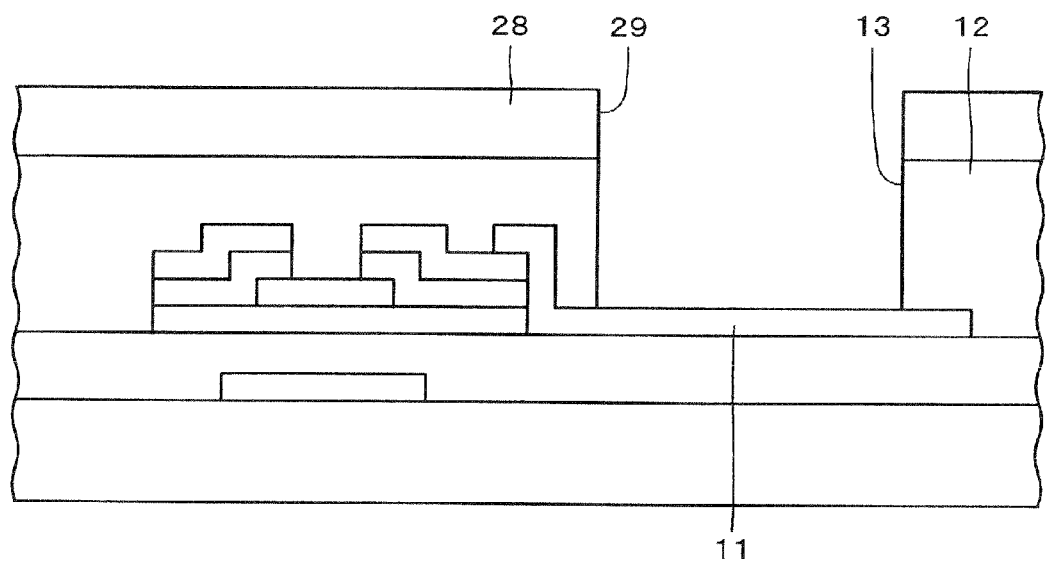
FIG. 9 is a cross-sectional view of a procedure subsequent to that in FIG. 8.

Next, the overcoat film 12 is dry etched using the resist film 28 as a mask. As a result, as shown in FIG. 9, the opening 13 is formed in the overcoat film 12 in the opening 29 of the resist film 28 or, in other words, in a portion of the overcoat film 12 corresponding to the areas other than the periphery of the pixel electrode 11. Then, the resist film 28 is peeled off. Consequently, the thin film transistor panel shown in FIG. 1 is obtained.

(First Dry Etching Device)

Next, an example of a first dry etching device used to form the channel protection film 5 by dry etching the silicon nitride film (channel protection film 5 formation film) 22 in the instances shown in FIG. 2 and FIG. 3 will be described with reference to a schematic diagram shown in FIG. 10. This dry etching device is a parallel-plate type, and includes a reaction container 31.

A lower electrode 32 is provided in a lower portion within the reaction container, and an upper electrode 33 is provided in an upper portion. In this embodiment, the lower electrode 32 is connected to a high-frequency power source 34, and the upper electrode 33 is grounded. A work piece 35 is placed on an upper surface of the lower electrode 32. A predetermined area in the lower portion of the reaction container 31 is connected to a vacuum pump 37 via a pipe 36.

A gas introducing pipe 38 is provided in the center of the upper portion of the reaction container in such a manner to penetrate through the center of the upper electrode 33. This gas introducing pipe 38, a first pipe 40, and a second pipe 41 are connected to a common pipe 39. These first and second pipes 40, 41 are provided with first and second electromagnetic valves 42, 43 and first and second mass flow controllers 44, 45, respectively. A carbonyl fluoride ($COF_2$) gas supply source 46 and an oxygen gas supply source 47 including a gas cylinder and the like are respectively connected to the ends of the first pipe 40 and the second pipe 41.

Next, a case is described where the first dry etching device is used to dry etch the silicon nitride film (channel protection film 5 formation film) 22 on the intrinsic amorphous silicon film (semiconductor film 4 formation film) 21 when the work piece 35 placed on the upper surface of the lower electrode 32 is in a state shown in FIG. 2. First, the vacuum pump 37 is driven to discharge the gas in the reaction container 31 so that the inside of the reaction container 31 is in a vacuum atmosphere in which the pressure is 1 Pa to 100 Pa.

Next, the first electromagnetic valve 42 and the second electromagnetic valve 43 are opened. As a result, a mixed gas of $COF_2$ gas and oxygen gas supplied from the $COF_2$ gas supply source 46 and the oxygen gas supply source 47 are introduced into the reaction container 31 from the gas introducing pipe 38. In this instance, the first mass flow controller 44 and the second mass flow controller 45 respectively adjust the flow rates of the $COF_2$ gas and the oxygen gas so that the flow rate of the $COF_2$ gas is 100 sccm, and the flow rate of the oxygen gas is 100 sccm to 400 sccm. In addition, a high-frequency power of 700 W at 13.56 MHz is applied from the high frequency power source 34.

Then, the silicon nitride film 22 in the areas other than the area under the resist film 23 is removed by being dry etched, where the etching rate is about 1500 Å/min. In this instance, when the silicon nitride film 22 in the areas other than the area under the resist film 23 is completely removed, the underlying intrinsic amorphous silicon film 21 is exposed as shown in FIG. 3. Although this exposed intrinsic amorphous silicon film 21 is dry etched to a certain extent and removed, the etching rate is about 210 Å/min. Therefore, the selection ratio in this instance is about seven-folds, which is practical. Moreover, the warming potential of $COF_2$ gas is 1, and this makes a great contribution to the reduction of the amount of global warming gas emissions.

In the manufacture of the channel-protection-film type thin film transistor 10 of a reverse-staggered type, for example, the film thickness of the silicon nitride film 22 is about 1200 Å and the film thickness of the intrinsic amorphous silicon film 21 is about 250 Å. On the other hand, when only $COF_2$ gas is used, the etching rate of the silicon nitride film 22 is relatively high at about 4000 Å/min.

Therefore, in dry etching using only $COF_2$ gas, there is a risk that a great portion of the intrinsic amorphous silicon film 21 is etched and removed. On the other hand, in the above-described dry etching method, since the mixed gas of $COF_2$ gas and oxygen gas is used as the etching gas, the etching rate of the silicon nitride film 22 is relatively low at about 1500 Å/min, and the etching rate of the intrinsic amorphous silicon film 21 is about 210 Å/min. These etching rates are practical etching rates.

That is, when the flow rate of the oxygen gas with respect to the $COF_2$ gas increases, the selection ratio increases but the etching rate decreases. As long as throughput can be reduced, processing can be performed even when the flow rate of the oxygen gas with respect to the $COF_2$ gas is increased by about four times, at maximum. On the other hand, the flow rate of the oxygen gas with respect to the $COF_2$ gas is limited to about 0.5, at minimum, because the etching rate of the underlying intrinsic amorphous silicon film 21 increases. Therefore, in the dry etching method described above, the flow rate of the oxygen gas with respect to the $COF_2$ gas is 0.5 to 4.

In the manufacture of the channel-protection-film type thin film transistor 10 of a reverse-staggered type, as described above, the film thickness of the intrinsic amorphous silicon film 21 is only about 250 Å, while the film thickness of the silicon nitride film 22 is about 1200 Å. Accordingly, a high selection ratio is required. Therefore, when the flow rate of the oxygen gas with respect to the $COF_2$ gas is 1.5 to 2, although the etching rate of the silicon nitride film 22 is about 1200 Å/min which is slightly lower than the instance described above (about 1500 Å/min), the selection ratio can be further increased. Therefore, the flow rate of the oxygen gas with respect to the $COF_2$ gas is preferably 1.5 to 2.

Note that the COF2 gas supply source 46 may supply dilution $COF_2$ gas diluted by one type of or a plurality of types of gas among any inert gas, such as nitrogen, helium, neon, and argon. For example, the flow rate of dilution $COF_2$ gas diluted to 20 vol % by nitrogen gas may be 500 sccm (the flow rate of only $COF_2$ gas is 100 sccm), and the flow rate of oxygen gas may be 100 sccm to 400 sccm. When the inert gas is added, the plasma state is stabilized and the evenness of etching is improved.

Further note that an inert gas supply source including a gas cylinder and the like may be provided in addition to the $COF_2$ gas supply source 46. It should be understood that, in this case, a pipe, an electromagnetic valve, and a mass flow controller accompanying the inert gas supply source are also provided. Also, as described above, even when inert gas is added, the flow rate of the oxygen gas with respect to the $COF_2$ gas is preferably 0.5 to 4, and more preferably 1.5 to 2.

(Second Dry Etching Device)

Figure 6:
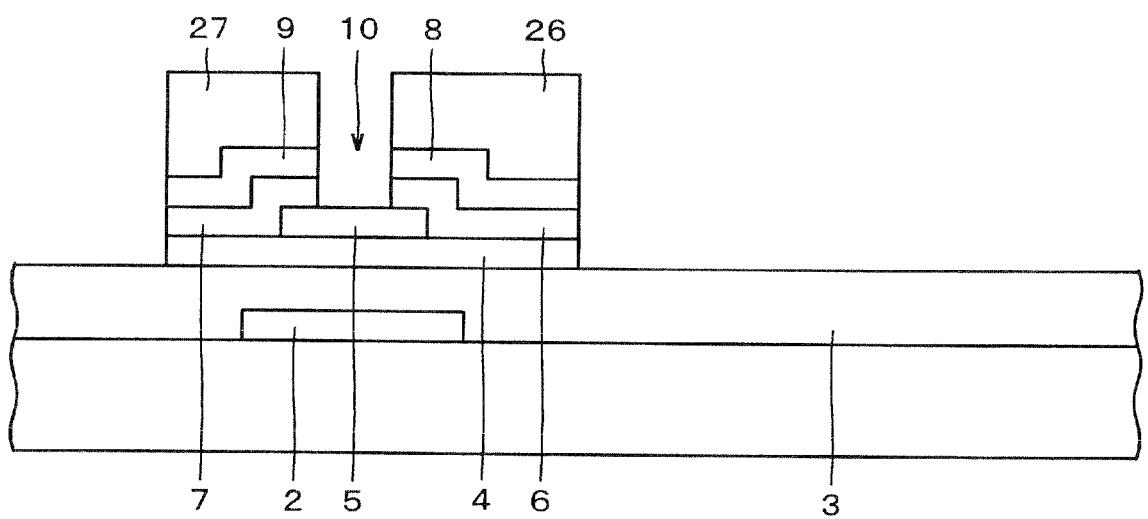
FIG. 6 is a cross-sectional view of a procedure subsequent to that in FIG. 5.

Next, an example of a second dry etching device used to form the ohmic contact layers 6 and 7, and the semiconductor thin film 4 by sequentially dry etching the n-type amorphous silicon film (ohmic contact layers 6 and 7 formation film) 24 and the intrinsic amorphous silicon film (semiconductor thin film 4 formation film) 21 in the instances shown in FIG. 5 and FIG. 6 will be described with reference to a schematic diagram shown in FIG. 11. The second dry etching device differs from the first dry etching device shown in FIG. 10 in that a chlorine gas supply source 48 is used instead of the oxygen gas supply source 47.

Next, a case is described where the second dry etching device is used to sequentially dry etch the n-type amorphous silicon film (ohmic contact layers 6 and 7 formation film) 24 and the intrinsic amorphous silicon film (semiconductor thin film 4 formation film) 21 on the gate insulating film 3 made of silicon nitride when the work piece 35 placed on the upper surface of the lower electrode 32 is in a state shown in FIG. 5. First, the vacuum pump 37 is driven to discharge the gas in the reaction container 31 so that the inside of the reaction container 31 is in a vacuum atmosphere in which the pressure is 1 Pa to 100 Pa.

Next, the first electromagnetic valve 42 and the second electromagnetic valve 43 are opened. As a result, a mixed gas of $COF_2$ gas and chlorine gas supplied from the $COF_2$ gas supply source 46 and the chlorine gas supply source 48 are introduced into the reaction container 31 from the gas introducing pipe 38. In this instance, the first mass flow controller 44 and the second mass flow controller 45 respectively adjust the flow rates of the $COF_2$ gas and the chlorine gas so that the flow rate of the $COF_2$ gas is 20 sccm to 200 sccm, and the flow rate of the chlorine gas is 200 sccm. In addition, a high-frequency power of 700 W at 13.56 MHz is applied from the high frequency power source 34.

Then, the n-type amorphous silicon film 24 and the intrinsic amorphous silicon film 21 in the areas other than the areas under the resist films 26 and 27, and the channel protection film 5 are removed by being sequentially dry etched, where the etching rate is about 1200 Å/min. In this instance, when the n-type amorphous silicon film 24 and the intrinsic amorphous silicon film 21 in the areas other than the areas under the resist films 26 and 27, and the channel protection film 5 are completely removed, the underlying gate insulating film 3 made of silicon nitride is exposed as shown in FIG. 6. Although this exposed gate insulating film 3 is dry etched to a certain extent and removed, the etching rate is about 400 Å/min. Therefore, the selection ratio in this instance is about three-folds, which is practical. Moreover, the warming potential of $COF_2$ gas is 1, and this makes a great contribution to the reduction of the amount of global warming emissions.

In dry etching using only chlorine gas, the etching rate of the amorphous silicon films 21 and 24 is only about 100 Å/min. However, when 10% (20 sccm) of $COF_2$ gas is added to the chlorine gas (200 sccm), a practical minimum etching rate is obtained. On the other hand, when the flow rate of the $COF_2$ gas is increased, although the etching rate of the amorphous silicon films 21 and 24 decreases, the etching rate of the underlying gate insulating film 3 made of silicon nitride increases. Therefore, the maximum flow rate of the $COF_2$ gas with respect to the chlorine gas is preferably about 1. Accordingly, in the dry etching method described above, the flow rate of the $COF_2$ gas with respect to the chlorine gas is 0.1 to 1.

When the flow rate of the $COF_2$ gas is 75 sccm with respect to a chlorine gas flow rate of 200 sccm, the etching rate reaches maximum. When the flow rate of the $COF_2$ gas with respect to the flow rate of the chlorine gas is any higher or lower, the etching rate gradually decreases. However, when the flow rate of the $COF_2$ gas is 50 sccm to 100 sccm with respect to a chlorine gas flow rate of 200 sccm, sufficient etching rate and selection ratio are obtained. Therefore, the flow rate of the $COF_2$ gas with respect to the chlorine gas is more preferably 0.25 to 0.5.

Note that the $COF_2$ gas supply source 46 may supply dilution $COF_2$ gas diluted by one type of or a plurality of types of gas among any inert gas, such as nitrogen, helium, neon, and argon. For example, the flow rate of the dilution $COF_2$ gas diluted to 20 vol % by nitrogen gas may be 100 sccm to 1000 sccm (the flow rate of only $COF_2$ gas is 20 sccm to 200 sccm), and the flow rate of the chlorine gas may be 200 sccm. When the inert gas is added, the plasma state is stabilized and the evenness of etching is improved.

Further note that an inert gas supply source including a gas cylinder and the like may be provided in addition to the $COF_2$ gas supply source 46. It should be understood that, in this instance, a pipe, an electromagnetic valve, and a mass flow controller accompanying the inert gas supply source are also provided. Also, as described above, even when inert gas is added, the flow rate of the $COF_2$ gas with respect to the chlorine gas is preferably 0.1 to 1, and more preferably 0.25 to 0.5.

Figure 11:
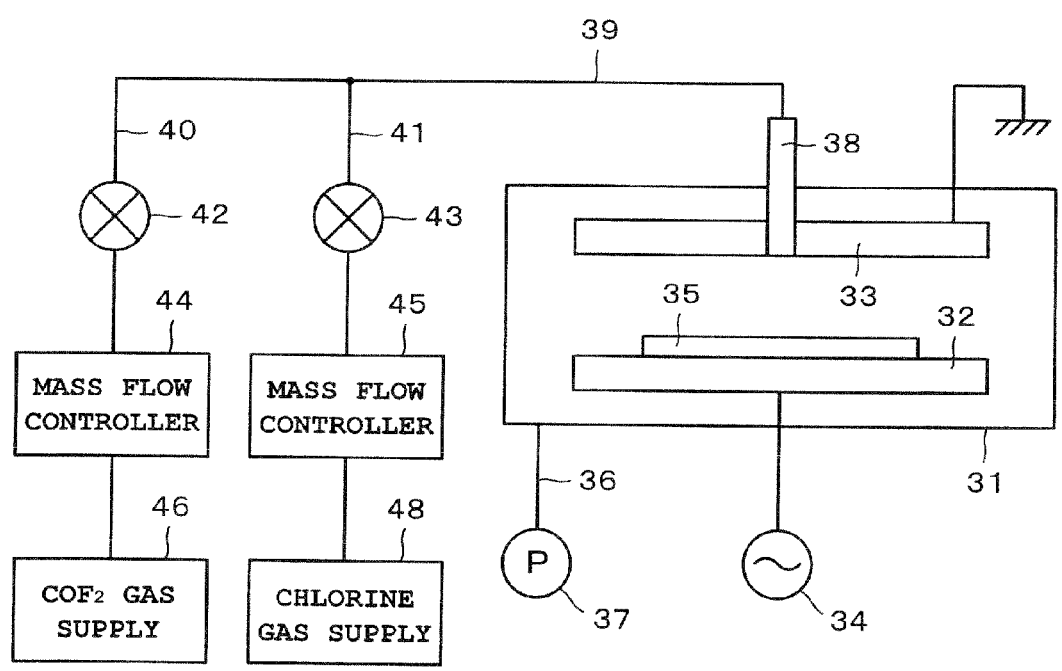
FIG. 11 is a schematic diagram of an example of a second dry etching device.

In the dry etching device shown in FIG. 11, a high frequency is applied to the lower electrode 32 on which the work piece 35 is placed, thereby facilitating the generation of cathode drop voltage on the grounded upper electrode 33 side, namely the cathode side, and ions generated by an electric discharge is used for a reaction. This is referred to as reactive ion etching (RUE), and is dry etching by cathode coupling.

This dry etching by cathode coupling enables anisotropic etching with slight side etching. However, in the dry etching by cathode coupling, ion bombardment caused by the cathode drop voltage on the cathode side may cause damage to transistor characteristics. Therefore, a case where ion damage can be reduced will be described next.

(Third Dry Etching Device)

Figure 12:
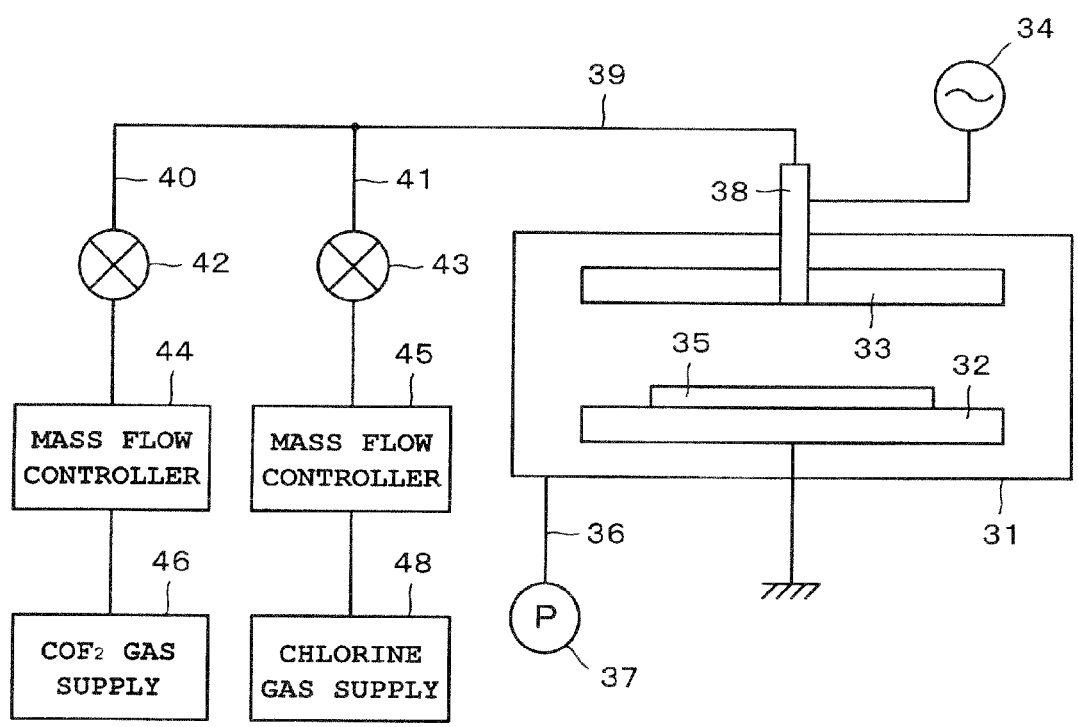
FIG. 12 is a schematic diagram of an example of a third dry etching device.

FIG. 12 is a schematic diagram of an example of a third dry etching device. The third dry etching device differs from the second dry etching device in FIG. 11 in that the lower electrode 32 is grounded and the upper electrode 33 is connected to the high frequency power source 34. Therefore, in the third dry etching device, dry etching is performed by anode coupling. In this dry etching by anode coupling, ion damage is reduced and transistor characteristics are improved as compared with dry etching by cathode coupling.

(Fourth Dry Etching Device)

Figure 13:
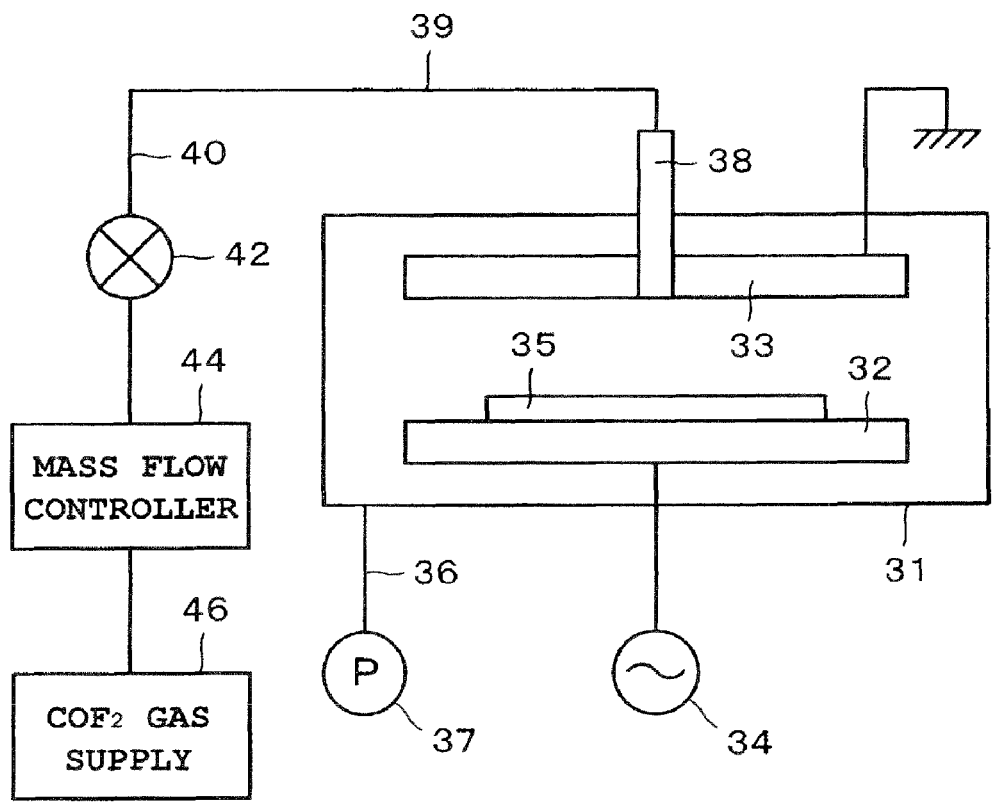
FIG. 13 is a schematic diagram of an example of a fourth dry etching device.

Next, an example of a fourth dry etching device for forming the opening 13 by dry etching the overcoat film 12 made of silicon nitride in the instances shown in FIG. 8 and FIG. 9 will be described with reference to a schematic diagram shown in FIG. 13. The fourth dry etching device differs from the first dry etching device in FIG. 10 in that the oxygen gas supply source 47 and its accompanying pipe 41, electromagnetic valve 43, and mass flow controller 45 are not provided.

Next, a case is described where the fourth dry etching device is used to dry etch the overcoat film 12 made of silicon nitride on the pixel electrode 11 made of ITO when the work piece 35 placed on the upper surface of the lower electrode 32 is in a state shown in FIG. 8. First, the vacuum pump 37 is driven to discharge the gas in the reaction container 31 so that the inside of the reaction container 31 is in a vacuum atmosphere in which the pressure is 1 Pa to 100 Pa.

Next, the first electromagnetic valve 42 is opened. As a result, $COF_2$ gas supplied from the $COF_2$ gas supply source 46 is introduced into the reaction container 31 from the gas introducing pipe 38. In this instance, the first mass flow controller 44 adjusts the flow rate of the $COF_2$ gas so that the flow rate of the $COF_2$ gas is 200 sccm. In addition, a high-frequency power of 600 W at 13.56 MHz is applied from the high frequency power source 34.

Then, a portion of the overcoat film 12 corresponding to the opening 29 in the resist film 28 is removed by being dry etched, where the etching rate is about 4000 Å/min. In this instance, when the portion of the overcoat film 12 corresponding to the opening 29 in the resist film 28 is completely removed, although the underlying pixel electrode 11 made of ITO is exposed as shown in FIG. 9, this exposed pixel electrode 11 is barely etched, and therefore it is practical.

Moreover, the warming potential of $COF_2$ gas is 1, and this makes a great contribution to the reduction of the amount of global warming emissions.

Figure 10:
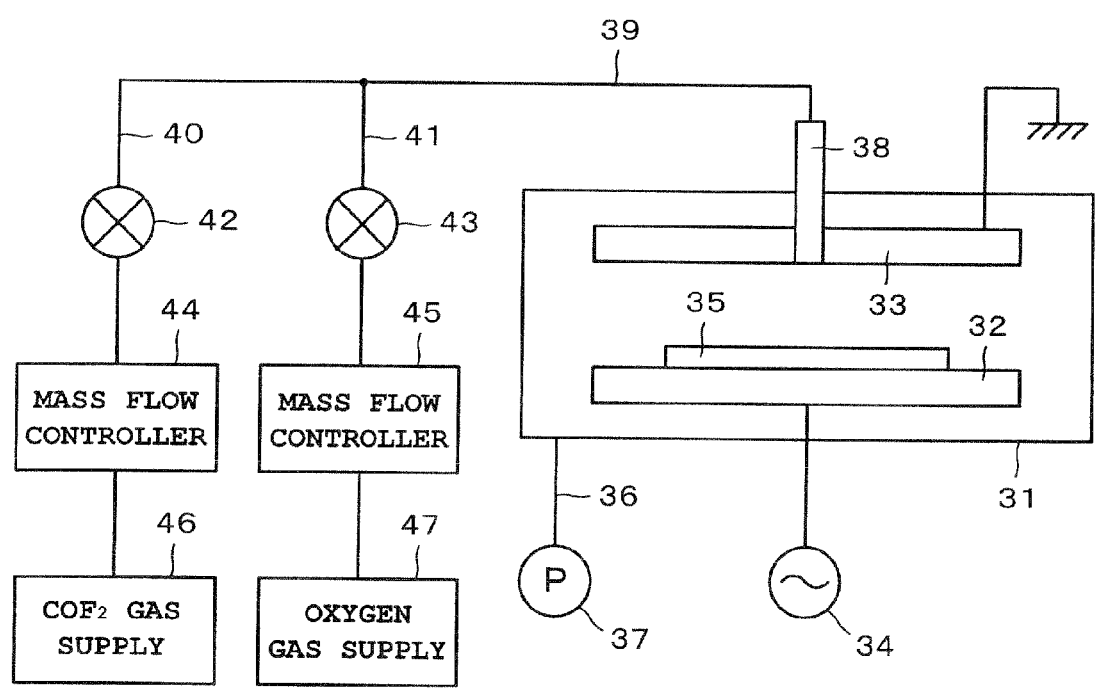
FIG. 10 is a schematic diagram of an example of a first dry etching device.

Note that the dry etching of the overcoat film 12 made of silicon nitride on the pixel electrode 11 made of ITO may be performed using the first dry etching device shown in FIG. 10.

In this instance, the flow rate of the oxygen gas with respect to the $COF_2$ gas is required to be 2 or less, or more preferably 0.2 to 0.3.

That is, the film thickness of the overcoat film 12 made of silicon nitride is relatively thick at, for example, 8000 Å, and the underlying pixel electrode 11 made of ITO is barely etched. Therefore, the etching rate of the overcoat film 12 is preferably increased. When 20 to 30% of oxygen gas is mixed with $COF_2$ gas, the etching rate of the overcoat film 12 increases by 30% to 40%, thereby reducing the etching time. On the other hand, when the added amount of oxygen gas is increased to a certain extent, the etching rate of the overcoat film 12 decreases, and therefore the flow rate of the oxygen gas with respect to the $COF_2$ gas is preferably 2 or less.

In this instance as well, the COF2 gas supply source 46 may supply dilution $COF_2$ gas diluted by one type of or a plurality of types of gas among any inert gas, such as nitrogen, helium, neon, and argon. When the inert gas is added, the plasma state is stabilized and the evenness of etching is improved.

Note that an inert gas supply source including a gas cylinder and the like may be provided in addition to the $COF_2$ gas supply source 46. It should be understood that, in this instance as well, a pipe, an electromagnetic valve, and a mass flow controller accompanying the inert gas supply source are also provided. Also, as described above, even when inert gas is added, the flow rate of the oxygen gas with respect to the $COF_2$ gas is preferably 2 or less, and more preferably 0.2 to 0.3.

Further note that, in the embodiment described above, a case where silicon films, such as a silicon nitride film, in the channel-protection-film type thin film transistor 10 of a reverse-staggered type are dry etched is described. However, the present invention is not limited thereto. For example, as an example shown in FIG. 14, silicon films, such as a silicon nitride film, in a channel-etch type thin film transistor 10 of a reverse-staggered type may also be dry etched.

Figure 14:
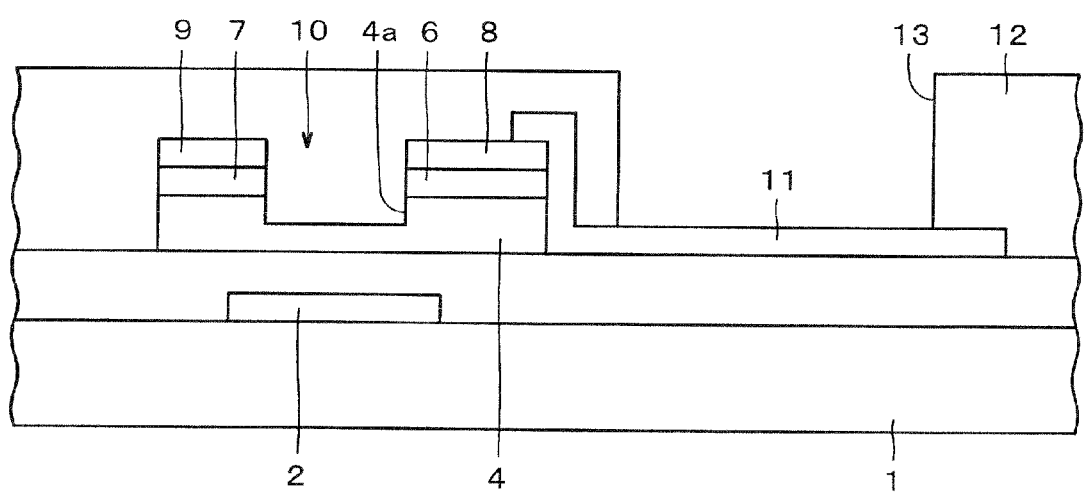
FIG. 14 is a cross-sectional view of another example of a thin film transistor panel manufactured by a manufacturing method including the dry etching method according to the present invention.

A thin film transistor panel shown in FIG. 14 differs from the thin film transistor panel shown in FIG. 1 in that the channel protection film 5 is not provided. Instead, a recess 4a is formed on the upper surface of the channel area of the semiconductor thin film 4. In this instance, the thickness of areas of the semiconductor thin film 4 other than the channel area is thicker than that of the semiconductor thin film 4 shown in FIG. 1.

Figure 15:
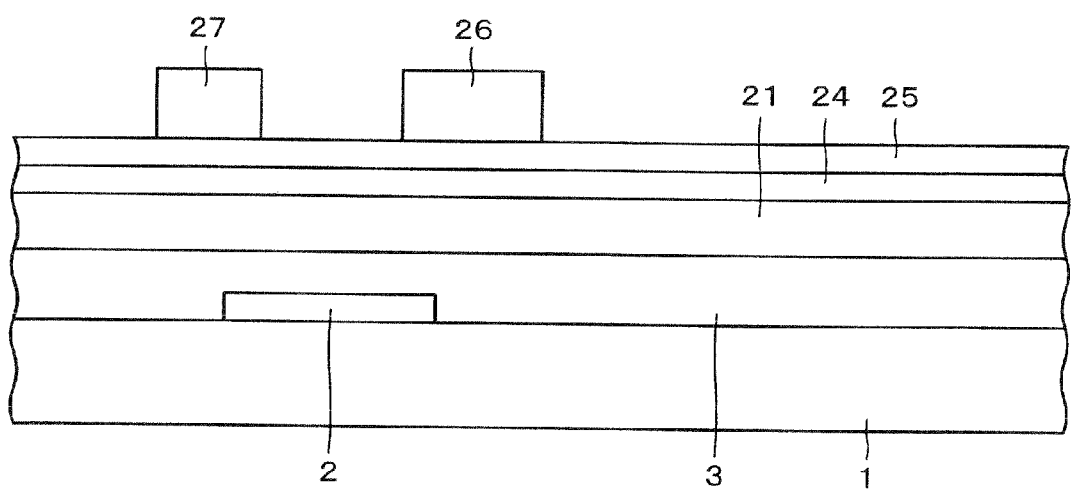
FIG. 15 is a cross-sectional view of an initial procedure in an example of the manufacturing method of the thin film transistor panel shown in FIG. 14.

Next, an example of a manufacturing method of the thin film transistor panel will be described. First, as shown in FIG. 15, the gate electrode 2 is formed on a predetermined portion of the upper surface of the glass substrate 1 by a metal film made of chrome and the like formed by sputtering being patterned by photolithographic method.

Then, the gate insulating film 3 made of silicon nitride, the intrinsic amorphous silicon film (semiconductor thin film 4 formation film) 21, and the n-type amorphous silicon film (ohmic contact layers 6 and 7 formation film) 24 are formed by plasma CVD on the upper surface of the glass substrate 1 including the gate electrode 2. In this instance, the thickness of the intrinsic amorphous silicon film 21 is thicker than that of the intrinsic amorphous silicon film 21 shown in FIG. 2.

Next, the source/drain electrode formation film 25 made of metal such as chrome is formed by sputtering on the upper surface of the n-type amorphous silicon film 24. Then, the resist films 26 and 27 are formed on a source electrode 8 formation area and a drain electrode 9 formation area of the upper surface of the source/drain electrode formation film 25 by a resist film applied by screen-printing, spin-coating, and the like being patterned by photolithographic method.

Figure 16:
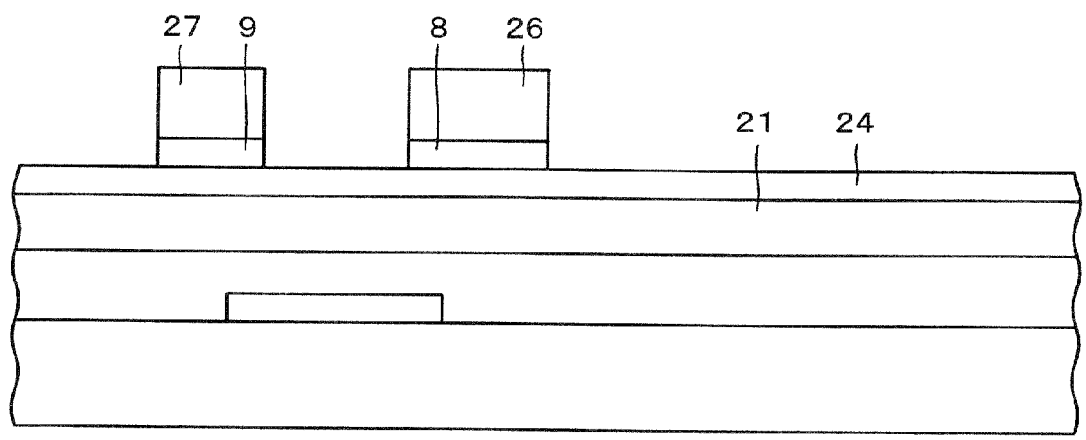
FIG. 16 is a cross-sectional view of a procedure subsequent to that in FIG. 15.

Next, the source/drain electrode formation film 25 is wet-etched using the resist films 26 and 27 as masks, and as a result the source/drain electrode formation film 25 is removed from areas other than the areas under the resist films 26 and 27, thereby forming the source electrode 8 and the drain electrode 9 under the resist films 26 and 27 as shown in FIG. 16.

Figure 17:
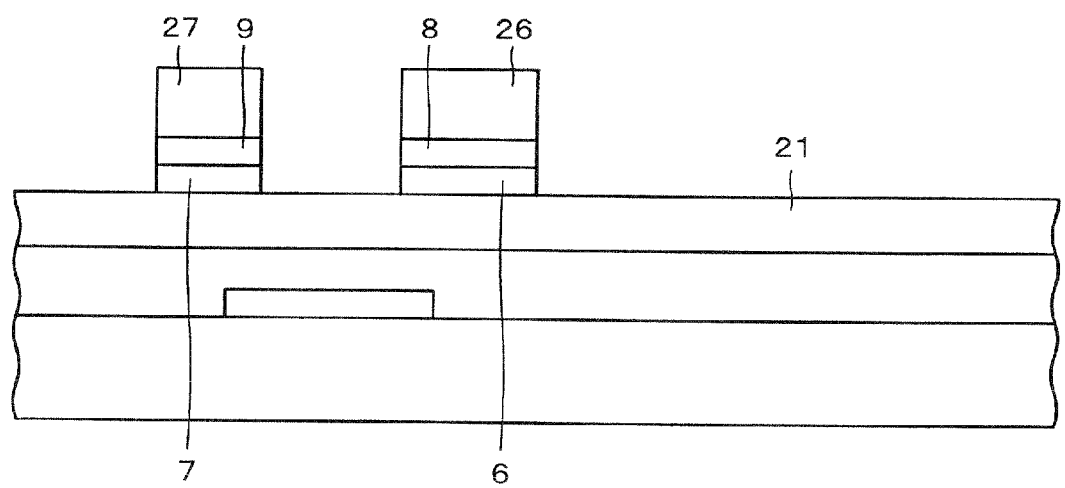
FIG. 17 is a cross-sectional view of a procedure subsequent to that in FIG. 16.

Then, the n-type amorphous silicon film 24 and the intrinsic amorphous silicon film 21 are sequentially dry etched using the resist films 26 and 27 as masks. In this instance, first, the n-type amorphous silicon film 24 in areas other than the areas under the resist films 26 and 27 is removed. As a result, as shown in FIG. 17, the ohmic contact layers 6 and 7 are formed under the source electrode 8 and the drain electrode 9.

Figure 18:
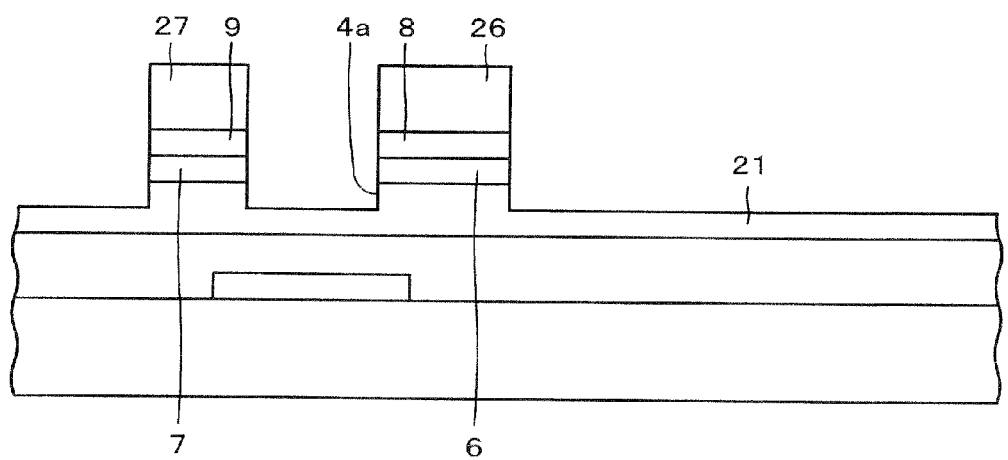
FIG. 18 is a cross-sectional view of a procedure subsequent to that in FIG. 17.

Next, the intrinsic amorphous silicon film 21 in areas other than the areas under the resist films 26 and 27 is half-etched. As shown in FIG. 18, the thickness of the intrinsic amorphous silicon film 21 in the areas other than the areas under the ohmic contact layers 6 and 7 is reduced. In this state, the recess 4a has been formed on the upper surface of the intrinsic amorphous silicon film 21 between the ohmic contact layers 6 and 7. Then, the resist films 26 and 27 are peeled off.

Figure 19:
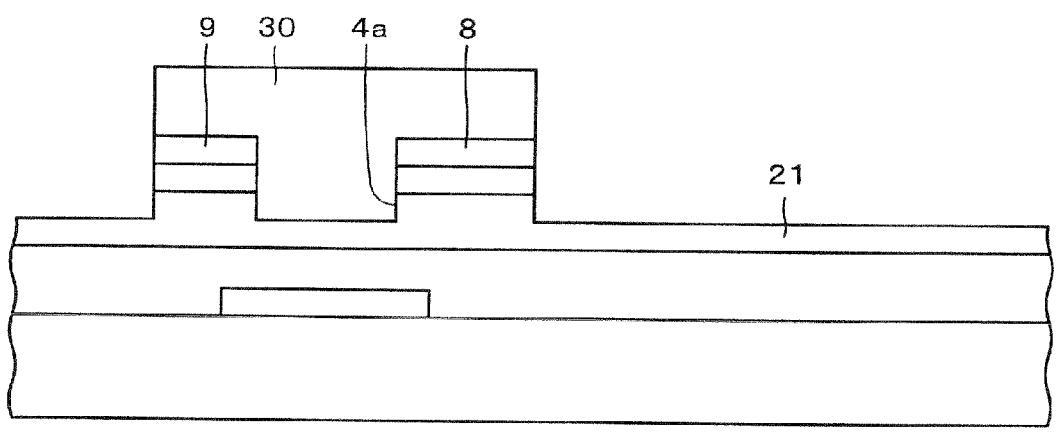
FIG. 19 is a cross-sectional view of a procedure subsequent to that in FIG. 18.
Figure 20:
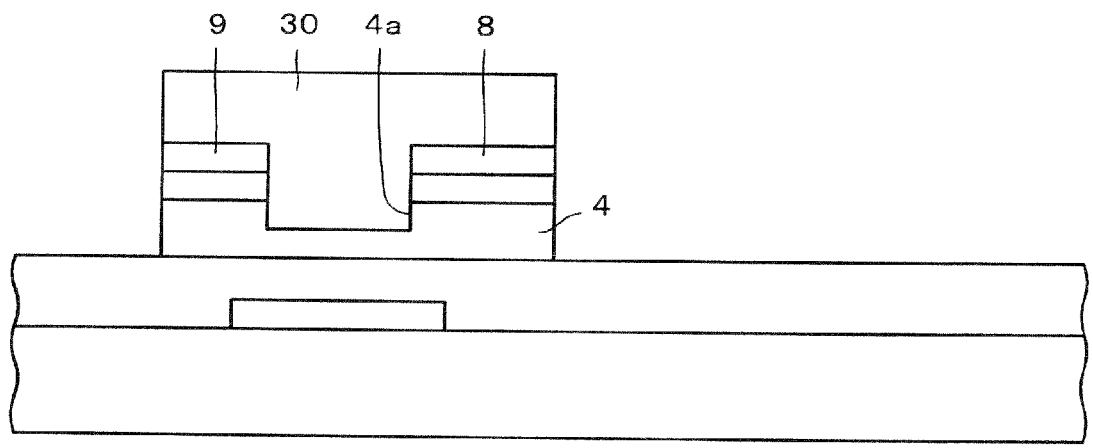
FIG. 20 is a cross-sectional view of a procedure subsequent to that in FIG. 19.

Next, as shown in FIG. 19, a resist film 30 is formed on the upper surfaces of the source electrode 8, the drain electrode 9, and the recess 4a section therebetween by a resist film applied by screen-printing, spin-coating, and the like being patterned by photolithography. Next, the intrinsic amorphous silicon film 21 is dry etched using the resist film 30 as a mask. As a result, the intrinsic amorphous silicon film 21 in areas other than the area under the resist film 30 is removed, thereby forming the semiconductor thin film 4 having the recess 4a under the resist film 30 as shown in FIG. 20.

In this state, the channel-etch type thin film transistor 10 of a reverse-staggered type has been formed by the gate electrode 2, the gate insulating film 3, the semiconductor thin film 4 including the recess 4a, the ohmic contact layers 6 and 7, the source electrode 8, and the drain electrode 9. Next, the resist film 30 is removed. Then, after procedures similar to those described above, the thin film transistor panel shown in FIG. 14 is obtained.

Here, the dry etching of the n-type amorphous silicon film 24 and the intrinsic amorphous silicon film 21 in this instance may be performed under the same conditions as the dry etching of the n-type amorphous silicon film 24 and the intrinsic amorphous silicon film 21 of the thin film transistor panel including the channel-protection-film type thin film transistor 10 of a reverse-staggered type.

In addition, the dry etching of the n-type amorphous silicon film 24 and the intrinsic amorphous silicon film 21 in this instance may be performed under the same conditions as the dry etching of the overcoat film 12 using an etching gas made of only $COF_2$ gas or an etching gas made of a mixed gas of $COF_2$ gas and oxygen gas in the thin film transistor panel including the channel-protection-film type thin film transistor 10 of a reverse-staggered type.

In the thin film transistor panel including the reverse-staggered thin film transistor 10, regardless of whether the thin film transistor 10 is a channel-protection-film type or a channel-etch type, a gate electrode external connection terminal made of the same metal as the gate electrode 2 is provided on the upper surface of the glass substrate 1, and connected to the gate electrode 2. In addition, a drain electrode external connection terminal made of the same metal as the drain electrode 9 is provided on the upper surface of the gate insulating film 3, and connected to the drain electrode 9.

In a thin film transistor such as this, in the formation of the opening 13 in the overcoat film 12, openings are simultaneously formed in portions of the overcoat film 12 and the gate insulating film 3 which correspond to the gate electrode external connection terminal. Also, an opening is formed in a portion of the overcoat film 12 which corresponds to the drain electrode external connection terminal. Accordingly, in addition to the pixel electrode 11 made of ITO, the gate electrode external connection terminal and the drain electrode external connection terminal made of metal such as chrome are included under the overcoat film 12.

In the above described embodiment, a case is described where silicon compound films, such as a silicon nitride film, an intrinsic amorphous silicon film, and an n-type amorphous silicon film, in a thin film transistor using amorphous silicon are dry etched. However, the present invention is not limited thereto. For example, in a thin film transistor using polycrystal silicon, a polycrystal silicon film formed on the upper surface of a silicon nitride film may be dry etched. In addition, in a thin film diode (TFD) using silicon, a silicon compound film formed on the upper surface of a silicon nitride film may be dry etched.

Figure 21:
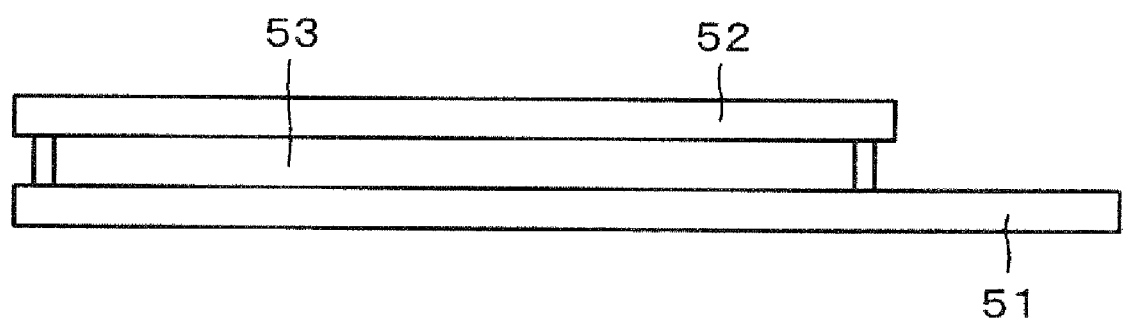
FIG. 21 is a diagram of an example of a liquid crystal display device.

The thin film transistor panel including the reverse-staggered thin film transistor 10, formed as described above, may be applied to an active substrate 51 of a pair of substrates 51 and 52 in a liquid crystal display device 50 such as shown in FIG. 21. The liquid crystal display device 50 is capable of displaying images by performing the orientation control of liquid crystal molecules in a liquid crystal layer 53 held between the pair of substrates 51 and 52, for each pixel. At this time, the thin film transistor 10 is used as a pixel transistor arranged for each pixel.

Figure 22:
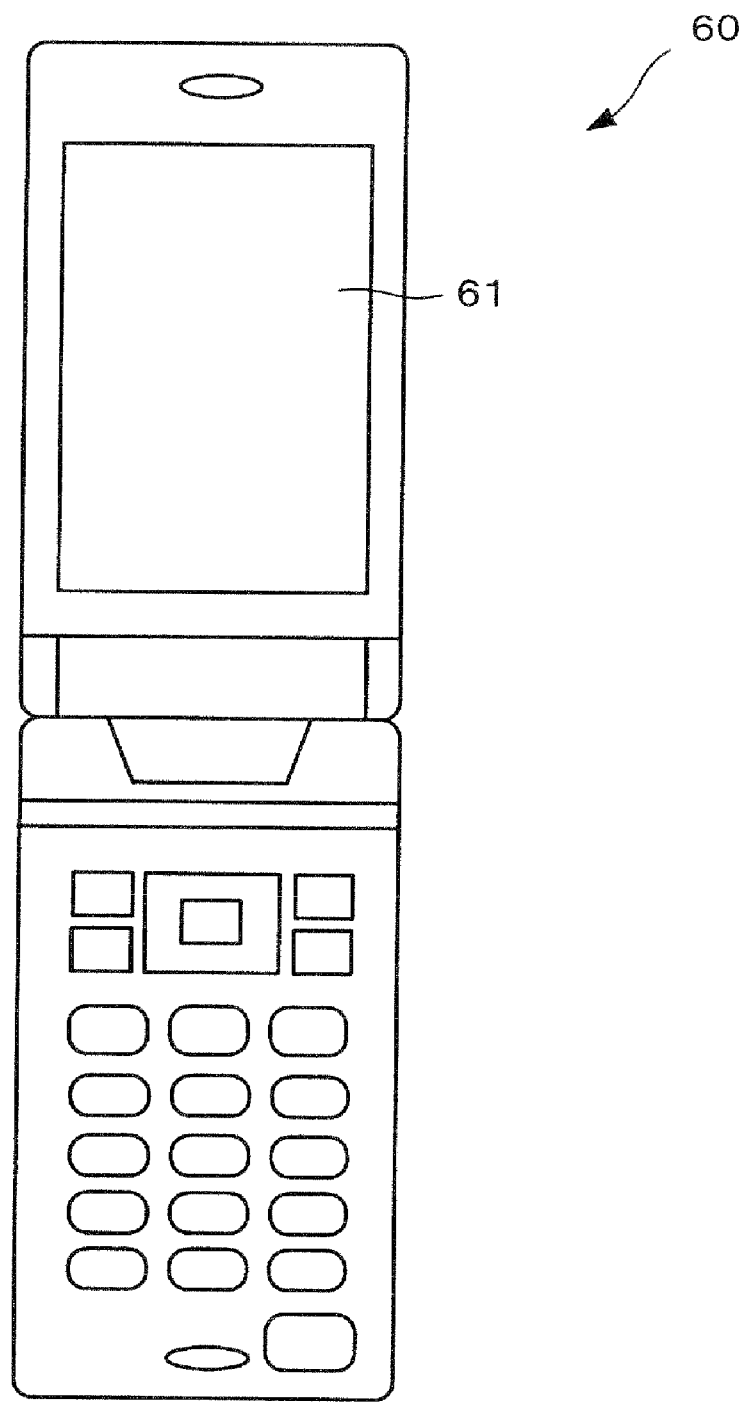
FIG. 22 is a diagram of an example of a mobile phone.

In addition, the above-described liquid crystal display device may be used, for example, as a monitor 61 in an electronic device such as an imaging device or a mobile phone 60 shown in FIG. 22.

While the present invention has been described with reference to the preferred embodiments, it is intended that the invention be not limited by any of the details of the description therein but includes all the embodiments which fall within the scope of the appended claims.

What is claimed is:

1. A method comprising:
dry etching an amorphous silicon film that is formed on a silicon nitride film, by parallel-plate type dry etching using an etching gas including at least $COF_2$;
wherein the dry etching achieves an etching rate of the silicon nitride film that is lower than an etching rate of the amorphous silicon film;
wherein the amorphous silicon film comprises an intrinsic amorphous silicon film and an n-type amorphous silicon film formed on the intrinsic amorphous silicon film;
wherein the method is performed in a process of manufacturing a channel-protection-film type thin film transistor of a reverse-staggered type, in which a silicon thin film is formed on a gate insulating film made of the silicon nitride film, and ohmic contact layers are formed on both sides of an upper surface of the silicon thin film;
wherein the n-type amorphous silicon film and the intrinsic amorphous silicon film are sequentially dry etched to form the ohmic contact layers and the silicon thin film;
wherein the etching gas is a mixed gas including $COF_2$ gas and chlorine gas; and
wherein the amorphous silicon film is etched while using the silicon nitride film as a stopper.

2. The method according to claim 1, wherein a flow rate of the $COF_2$ gas with respect to the chlorine gas is 0.1 to 1.

3. The method according to claim 1, wherein a flow rate of the $COF_2$ gas with respect to the chlorine gas is 0.25 to 0.5.

4. The method according to claim 1, wherein the dry etching is performed by cathode coupling.

5. The method according to claim 1, wherein the dry etching is performed by anode coupling.

6. The method according to claim 1, wherein the etching gas further includes inert gas.

7. The method according to claim 1, wherein the dry etching is performed in a vacuum atmosphere of 1 to 100 Pa.

8. The method according to claim 1, wherein the etching rate of the amorphous silicon film by the etching gas is not less than double the etching rate of the silicon nitride film.

9. The method according to claim 1, wherein the etching rate of the amorphous silicon film by the etching gas is not less than triple the etching rate of the silicon nitride film.

10. A method comprising:
simultaneously dry etching a first silicon film formed on a first silicon nitride film, and a second silicon film formed on a second silicon nitride film, the second silicon film being thicker than the first silicon film, by parallel-plate type dry etching using an etching gas including at least $COF_2$, thereby exposing upper surfaces of the first silicon nitride film and the second silicon nitride film;
wherein the etching gas is a mixed gas including $COF_2$ gas and chlorine gas; and
wherein the first silicon film is etched while using the first silicon nitride film as a stopper.

11. The method according to claim 10, wherein the first and second silicon films are amorphous silicon films.

12. The method according to claim 10, wherein the first silicon film includes an n-type amorphous silicon film formed on the first silicon nitride film, and the second silicon film includes an intrinsic amorphous silicon film formed on the second silicon nitride film and an n-type amorphous silicon film formed on the intrinsic amorphous silicon film.

13. The method according to claim 12, wherein the first silicon nitride film is formed on the second silicon nitride film with the intrinsic amorphous silicon film intervening between the first silicon nitride film and the second silicon nitride film.

14. The method according to claim 12, the method is performed in a process of manufacturing a channel-protection-film type thin film transistor of a reverse-staggered type; and
wherein the n-type amorphous silicon film and the intrinsic amorphous silicon film are sequentially dry etched, thereby
(i) removing the n-type amorphous silicon film in an area on the first silicon nitride film between a source electrode formation area and a drain electrode formation area, the first silicon nitride film serving as a channel protection layer, so as to expose an upper surface of the first silicon nitride film and leave the n-type amorphous silicon film in the source electrode formation area and the drain electrode formation area, while
(ii) removing the n-type amorphous silicon film and the intrinsic amorphous silicon film in areas on the second silicon nitride film other than areas under the source electrode formation area, the drain electrode formation area, and the channel protection layer, the second silicon nitride film serving as a gate protection layer, so as to expose an upper surface of the second silicon nitride film and leave the intrinsic amorphous silicon film as a semiconductor thin film in the areas under the source electrode formation area, the drain electrode formation area, and the channel protection layer which are on the second silicon nitride film, and leave the n-type amorphous silicon film as ohmic contact layers on both sides of an upper surface of the semiconductor thin film.

15. The method according to claim 10, wherein the etching gas further includes inert gas.

16. The method according to claim 10, wherein an etching rate of the first silicon film by the etching gas is not less than double an etching rate of the first silicon nitride film.

17. The method according to claim 10, wherein an etching rate of the first silicon film by the etching gas is not less than triple an etching rate of the first silicon nitride film.

* * * * *